United States Patent [19]
Maddy et al.

[11] Patent Number: 5,334,952
[45] Date of Patent: Aug. 2, 1994

[54] FAST SETTLING PHASE LOCKED LOOP

[75] Inventors: Steven L. Maddy; Graeme S. Paterson, both of Boulder, Colo.

[73] Assignee: SpectraLink Corporation, Boulder, Colo.

[21] Appl. No.: 38,147

[22] Filed: Mar. 29, 1993

[51] Int. Cl.[5] .................. H03L 7/08; H03L 7/085; H03L 7/10; H03L 7/16
[52] U.S. Cl. ................... 331/1 A; 331/10; 331/14; 331/16; 331/17
[58] Field of Search ............ 331/14, 16, 17, 1 A, 331/10, 18, 25

[56] References Cited

U.S. PATENT DOCUMENTS

| | | | |
|---|---|---|---|
| 4,105,948 | 8/1978 | Wolkstein | 331/14 |
| 4,380,742 | 4/1983 | Hart | 331/1 |
| 4,568,888 | 2/1986 | Kimura et al. | 331/16 X |
| 4,932,074 | 6/1990 | McCormick, II | 455/167 |
| 4,937,536 | 6/1990 | Reinhardt et al. | 331/8 |
| 4,980,652 | 12/1990 | Tarusawa et al. | 331/10 X |
| 5,128,632 | 7/1992 | Erhart et al. | 331/16 X |
| 5,130,670 | 7/1992 | Jaffe | 331/14 X |
| 5,175,729 | 12/1992 | Borras et al. | 370/79 |

OTHER PUBLICATIONS

Kuge, J. et al; "Fast Hopping Frequency Synthesizer with Small Frequency Error"; *Proceedings IEEE ICWC;* pp. 215-218; 1992 (no month).

*Primary Examiner*—David Mis
*Attorney, Agent, or Firm*—Dorr, Carson, Sloan & Peterson

[57] ABSTRACT

A phase locked loop including a switch between a phase detector output and a VCO input to open the PLL during a frequency change is provided. While the PLL is open, an analog error correction signal is generated by sampling any residual error coming from the phase detector, and generating the analog error correction signal to counter the residual error. Once analog error correction signal is available, the switch is closed and the error correction signal is added to the phase detector output and the PLL is allowed to settle to an optimized frequency.

10 Claims, 5 Drawing Sheets

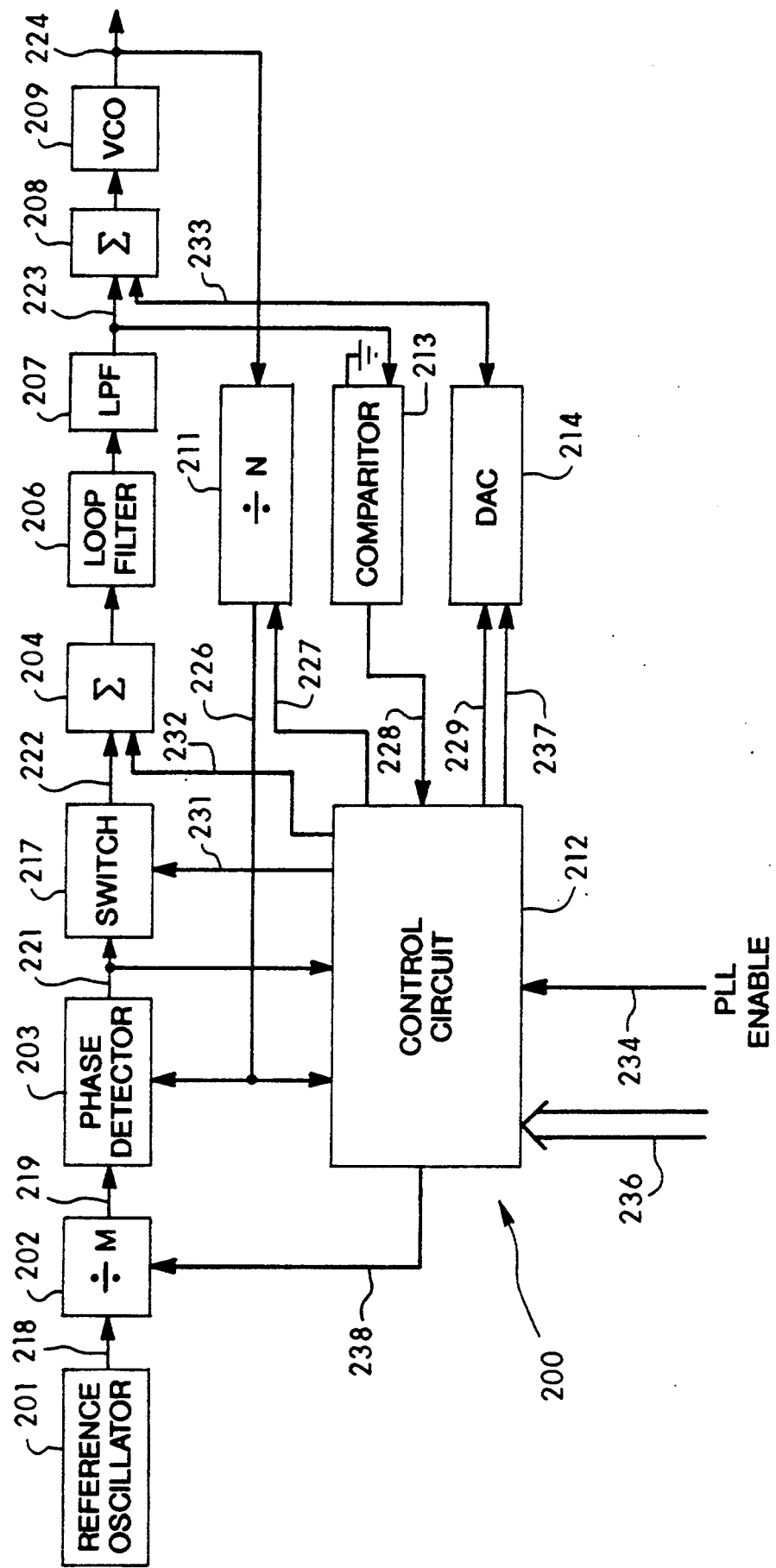

FAST SETTLING PHASE LOCKED LOOP

BACKGROUND OF THE ART

1. Field of the Invention

The present invention relates to phase locked loops and, more particularly, to a phase locked loop which settles quickly to a usable condition.

2. Statement of the Problem

Phase locked loops (PLLs) are often used in communications equipment to synthesize the transmit output frequency or channel of the communications equipment. In communication systems in general, the ability to change transmit output frequency rapidly is critical and any delay caused by the settling time of the phase locked loop wastes time that would otherwise be used to transmit data between users of the communication system.

Frequency hopping spread spectrum systems, for example, require the transmitter and receiver to rapidly "hop", in unison, on several operating channels, or different frequencies. In frequency hopping systems the operating frequency changes often, up to several times for each digital bit of transmitted data. Another example is a transceiver that transmits during a first time period and receives during a second time period. Where the transmitter circuit and receiver circuit share a single PLL, the PLL must change output frequencies each time the transceiver switches from transmit to receive. Each time the output frequency changes, the communications equipment must wait until the PLL settles to steady state before data can be reliably transmitted, resulting in reduced data rates. Reduced data rates, in turn, result in poorer quality communication, and fewer customers that can be served by the communications equipment.

Prior phase lock loops require time to lock on to the correct phase before their output frequency is stable enough to use. FIG. 1a illustrates a prior art PLL used for frequency synthesis. PLL 100 has a voltage controlled oscillator (VCO) 109 that generates an output 124 proportional to a voltage input coming from summing circuit 108. Summing circuit 108 combines voltage signals from a digital-to-analog converter (DAC) 114 and from loop filter 106, which will be described in greater detail below.

Loop filter 106 receives an input from an output of phase detector 103. The output of phase detector 103 is a function of the phase difference between two inputs; a first input coming from reference oscillator 101 and a second input provided by feeding back the output 124 of VCO 109 through a divide by N block 111. The output of phase detector 103 can be an analog signal or a pulse width modulated signal. Divide by N block 111 serves to divide the signal on output 124 by an integer N and provide frequency gain for PLL 100 so that the output of VCO 109 can be higher than that of reference oscillator 101. Control logic 112 can provide an input to divide by N block 111 over line 113 to adjust the integer N to provide variable frequency output.

Loop filter 106 determines the response time and bandwidth of PLL 100 and removes noise components from the control voltage applied to VCO 109. To provide a high quality signal on output 124, loop filter 106 should ideally provide PLL 100 with narrow bandwidth. However, a narrow bandwidth increases the time required for PLL 100 to settle during a frequency change.

U.S. Pat. No. 5,175,729 issued to Borras et al. shows a method of decreasing settling time by providing two loop filters 106, one that provides a narrow bandwidth and another that provides a wider bandwidth. The wider bandwidth filter is switched in during a frequency change, and the narrow bandwidth filter switched in once the PLL has approached a steady state. Unfortunately, the process of switching the filters itself generates noise and transients which are a source of settling time delay. Also, the bandwidth provided by loop filter 106 is only one source of settling time delay for PLL 100, and so the circuit of the '729 patent provides only limited improvement.

Another method of reducing settling time in PLL 100 involves pretuning VCO 109 to approximate the desired frequency just prior to the frequency change command to PLL 100. U.S. Pat. No. 4,380,742 issued to Hart and U.S. Pat. No. 4,932,074 issued to McCormick show methods of pretuning VCO 109 using a DAC, such as DAC 114 in FIG. 1a, to provide a voltage to the input of VCO 109 through a summing circuit 108. The voltage provided by DAC 114 reduces the frequency excursion required by PLL 100, and thus reduces time required to settle to a steady state. Control logic 112, which may include a microprocessor, addresses a look-up table 116 over line 111 which provides digital input to DAC 114. The digital data stored in look-up table 116 corresponds to a required voltage output for DAC 114 to produce a desired frequency output from VCO 109. The contents of look-up table 116 are determined by calibrating the system.

Although use of DAC 114 reduces settling time for PLL 100, the values stored in look-up table 116 are fixed at the time of calibration, and are accurate only when PLL 100 operates in an environment similar to that existing at the time of calibration. Also, fixed values in look-up table 116 cannot account for gradual changes in device parameters that accumulate over time. As a result, the output of DAC 114 is only an approximation of the correct voltage to pretune VCO 109, and the PLL circuit must finally tune the output to the correct frequency before it can be used. The settling time of PLL 100 using DAC 114 will vary considerably based on the accuracy of information in look-up table 116. Moreover, even if DAC 114 provides an accurate voltage to VCO 109, a phase error will exist between the reference inputs to phase detector 103. PLL 100 attempts to correct this phase error even when the output frequency is correct, resulting in a finite time delay before PLL 100 can settle to steady state.

FIG. 1b illustrates a simplified timing diagram of a frequency change occurring in the prior art PLL 100 of FIG. 1. PLL 100 is required to switch between frequencies $f_1$, $f_2$, and $f_3$ at predetermined intervals. At time $pt_1$ DAC 114 is prepared with new digital data to pretune VCO 109 during the frequency hop. At time $pt_2$ DAC 114 is caused to place the new output voltage as an input to VCO 109. The portion of time that having an X drawn through it between $pt_2$ and $pt_3$ in FIG. 1b is the settling time required before the new frequency is usable. Typically, settling time of a prior art PLL 100 is about 500 microseconds. For example, the X in the early portion of the $f_2$ timeframe indicates that the output of PLL 100 is not sufficiently stable to be used to reliably transmit or receive data. It is also apparent from FIG. 1b that a large portion of each timeframe is wasted while PLL 100 settles. For example, even in a slow frequency hopping system that changes frequency every 10 milliseconds, the settling time is almost 5 percent of the total time available at that frequency. This wasted portion of each time frame reduces the effective bandwidth, resulting in poorer communication quality and fewer people served by the communication equipment using PLL 100.

A need exists, especially in communication environments, for a phase locked loop that settles to a desired frequency without requiring a switched loop filter. A further need exists for a phase locked loop that when signalled to change to a new frequency produces an output frequency that is quickly available for use without waiting for settling to the new frequency.

SUMMARY OF THE INVENTION

Briefly stated, the present invention provides a phase locked loop including a switch between a phase detector output and a VCO input to open the PLL. A DAC pretune circuit is included and activated after the loop is switched open to prevent the PLL from responding to transients during the frequency change. The DAC pretune circuit is supplied with digital data stored at an address in a memory. A first divider circuit is used to divide a reference frequency oscillator output before it is applied to an input of a phase detector circuit. A second divider circuit is used to divide a feedback frequency from the output of the VCO. While the PLL is open, the first divider is reset to phase synchronize the output of the first divider with the output of the second divider. An analog error correction signal is generated by sampling any residual error coming from the phase detector, and generating the analog error correction signal to counter the residual error. Once the analog error correction signal is available, the switch is closed and the error correction signal is added to the phase detector output and the PLL is allowed to settle to an optimized frequency.

The PLL in accordance with the present invention preferably includes a narrow bandwidth loop filter between the switch and the VCO input. The PLL further includes a comparator for sampling the input voltage to the VCO once the PLL is fine tuned and updating the stored digital code in the memory for use the next time the PLL must output the current frequency. The PLL includes a control circuit for providing control inputs to the switch, DAC, and addressing the memory.

DESCRIPTION OF THE DRAWING

FIG. 1b (Prior Art) is a simplified timing diagram showing settling time of the prior art PLL shown in FIG. 1a;

FIG. 2 sets forth a simplified block diagram of a PLL circuit of the present invention;

DETAILED SPECIFICATION

1. Overview

Figure 1A:
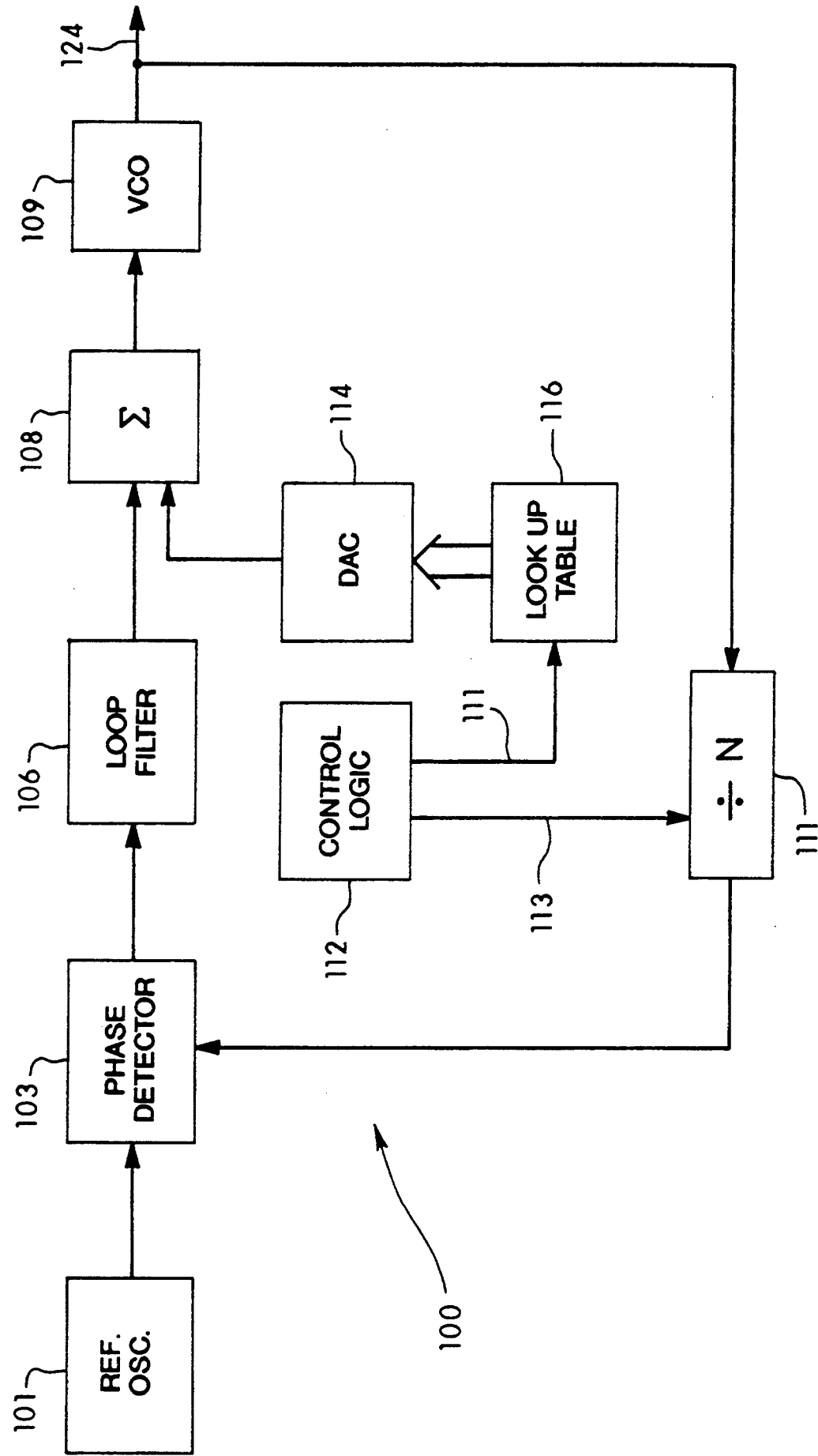
FIG. 1a (Prior Art) illustrates in block diagram form a prior art phase locked loop including a DAC pretune circuit used to describe the shortcomings of prior PLL methods.
Figure 1B:
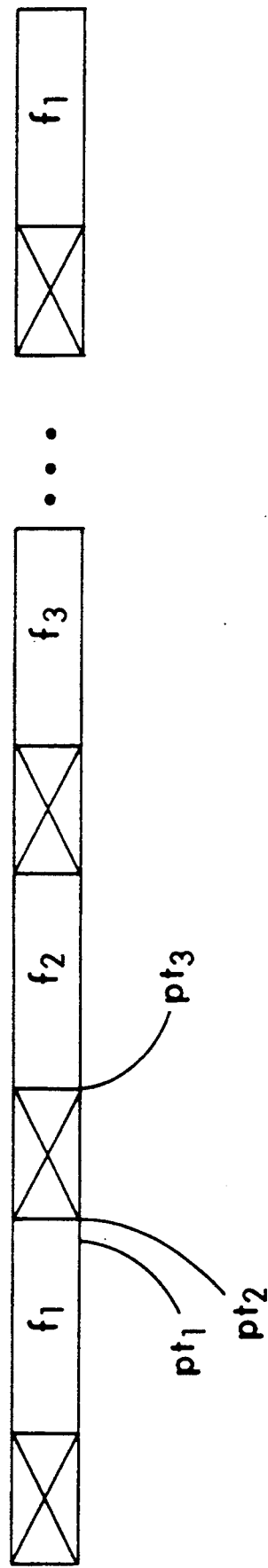

The phase locked loop (PLL) 200 in accordance with the present invention is shown in block diagram form in FIG. 2. PLL 200 uses a reference oscillator 201 to provide a rapidly variable yet stable output frequency on output 224 of a voltage controlled oscillator (VCO) 224. Reference oscillator 201 may be any free running stable oscillator capable producing an reference frequency suitable for a particular application.

Reference oscillator output node 218 is coupled to an input of divide-by-M circuit 202. Divide-by-M circuit 202 provides an output on node 219 that is a fraction 1/M of the frequency on node 218. Divide-by-M circuit 202 usually comprises a binary counter that produces one output pulse for every M input pulses. In accordance with the present invention, divide-by-M circuit 202 also receives an input over line 238 from control circuit 212 for resetting the counter in divide-by-M circuit 202, as explained in greater detail hereinafter.

Divide-by-N circuit 211 operates in a similar fashion to the divide-by-M circuit 202. Divide-by-N circuit 211 is coupled to output 224 to receive the output frequency, and divides the frequency by an integer N. The divided frequency is provided on node 226 which is coupled to both phase detector 203 and control circuit 212. Divide-by-N circuit 211 receives an input from control circuit 212 on line 227 that causes divide-by-N circuit 211 to change the integer value N used as a divisor. Integrated circuits suitable for dividers 202 and 211 are commercially available from many manufacturers.

The output reference frequency is provided by divide-by-M circuit on line 219 is coupled to a first input of phase detector 203. The divided output frequency is provided by divide-by-N circuit 211 on line 226 to a second input of phase detector 203. Phase detector 203 generates a signal on line 221 that is proportional to the phase difference between the divided reference signal on line 219 and the divided output signal on line 226. Preferably the output signal from phase detector 203 is pulse width modulated (PWM) meaning that the phase difference is indicated by a pulse width of a pulsed output on line 221. Alternatively, phase detector 203 can output an analog signal. Phase detectors with both PWM output and analog output are well known, and commercially available as discrete or integrated circuits.

The analog signal from phase detector 203 is coupled to switch 217. Switch 217 is controlled by an input on line 231 from control circuit 212. When switch 217 is closed, the signal on line 221 is coupled to line 222. When switch 217 is open, however, line 221 is isolated from line 222 and thus the output of phase detector 203 is decoupled from the remainder of PLL 200, and the phase locked loop is open. Switch 217 can be realized with any well known high speed switching device including bipolar and MOS transistors.

Summation circuit 204 receives inputs from switch 217 on line 222 and control circuit 212 on line 232. As described below, control circuit 212 provides an analog correction signal on line 232. Summation circuit 204 adds the analog signals on lines 222 and 232 to provide a summation signal coupled to loop filter 206.

Loop filter 206 comprises an integrator having a time constant used to set the response time and bandwidth of PLL 200. As will be seen, improvements in settling time provided by the present invention allow PLL 200 to be designed to have narrow bandwidth and fast response time, further improving overall settling time for PLL 200 in accordance with the present invention. The output of loop filter 206 is coupled to an input of low pass filter 207. Low pass filter 207 serves to remove unwanted signals passed by loop filter 206 and to provide a high degree of spectral purity towards VCO 209. Because loop filter 206 is an integrator, it converts any input in PWM form from phase detector 203 into an analog signal. Design and construction of both loop filter 206 and low pass filter 207 are well known.

The output of low pass filter 207 is provided on node 223 and is coupled to a voltage summing circuit 208. Voltage summing circuit 208 receives a first input from low pass filter 207 and a second input from digital-to-analog converter (DAC) 214 on line 233. Voltage summing circuit 208 adds the two first and second inputs to generate a drive voltage for VCO 209. The output of low pass filter 207 is also coupled to an input of comparator circuit 213, described below.

DAC 214, which provides an analog voltage to voltage summing circuit 208 on line 233, receives a stored digital code from control circuit 212 on lines 237 and generates an analog output corresponding to the digital code on line 237 in response to a control signal on line 229 from control circuit 212. The control signal on line 229 causes DAC 214 to change from its current output voltage to a new output voltage determined by the digital code on lines 237. DAC 214 is a conventional DAC circuit and desirably provides many more unique output voltages than the number of frequencies that PLL 200 must produce, for reasons that are more apparent hereinafter. For example, if PLL 200 must produce 50 unique frequencies at output 224, DAC 214 should produce many more than 50 unique voltages on output 233, and preferably is capable of producing several hundred. Accordingly, DAC 214 must have a sufficient number of binary bits of input from control circuit 212 to produce the unique output voltages. In the preferred embodiment, DAC 214 provides at least 4096 unique outputs and accepts 12 bits of digital input.

The entire circuit of PLL 200 is enabled by a PLL enable line 234 coupled to control circuit 212. PLL enable line 234 allows external control of PLL 200 to instruct control circuit 212 when to change frequency and what frequency should be produced. Also, control circuit 212 receives external control signals on bus 236 that provide other information such as timing signals and signals indicating which frequency PLL 200 should be operating on.

In summary, the output frequency on output 224 is maintained in a steady state after quickly settling because any frequency or phase error at the inputs to phase detector 203 causes phase detector 203 to produce an analog output that is switched, filtered, and transferred to the drive input of VCO 209. Phase detector 203 continues to generate an output until phase lock between the divided output signal on line 226 and the divided reference signal on line 219 is achieved. When phase lock is achieved, PLL 200 remains in a steady state until perturbed again by another frequency change. An important feature of the present invention is its response to a frequency change as described below.

2. Pretuning

Continuing with FIG. 2., a frequency change is initiated by a command to change frequencies from external circuitry on bus 236. The external circuitry will also provide "next-frequency" information on bus 236 about which frequency PLL 200 should move to. It should be understood that for particular applications the next-frequency information, as well as the timing of the frequency change might be generated by logic circuits or a microprocessor within control circuit 212 itself rather than provided by external circuitry. The particular configuration is a matter of choice to meet the design criteria of a particular application and does not limit the teachings of the present invention.

Control circuit 212 next provides new digital data on line 237 to DAC 214. In a preferred embodiment, the new digital data is transferred serially to DAC 214 and temporarily stored in an input buffer integral with DAC 214. After the digital data is transferred, control circuit 212 generates a control signal on line 231 which opens switch 217. The opening of switch 217, and thus the opening of PLL 200, is an important feature of the present invention. Because PLL 200 already had settled to a steady state before opening switch 217, the output of phase detector 203 is substantially zero, and the opening switch 217 does not cause any immediate effect. Likewise, control circuit 212 freezes the analog error correction signal on line 232 so that any error correction response does not affect VCO 209 until after the frequency change is complete.

In other words, when PLL 200 has reached steady state and is providing a stable output signal of a desired frequency, the output of phase detector 203 is near zero and the analog value on line 232 is constant and is the value being delivered by the summer 204 to maintain the stable VCO 209 output. Just prior to changing PLL 200 to a new frequency, switch 217 is opened and the analog value on line 232 is frozen. These two events do not immediately affect the stable output of VCO 209.

Figure 1C:
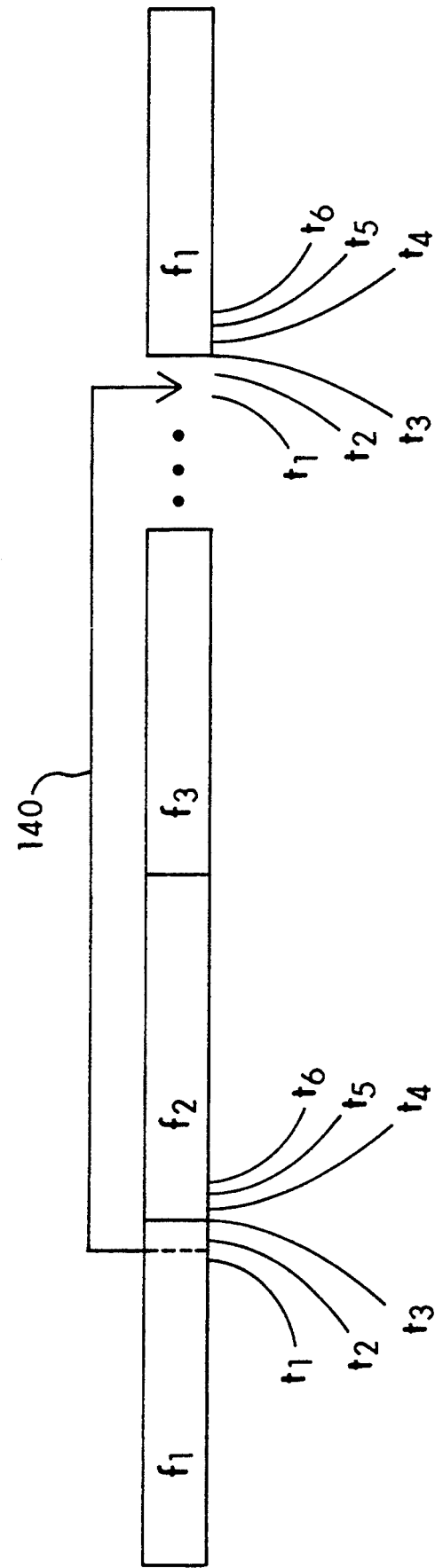
FIG. 1c is a simplified timing diagram of an frequency switching PLL in accordance with the present invention.

After switch 217 is open, the entire drive voltage for VCO 209 is generated by DAC 214 plus any residual error correction signal provided on line 232. Control circuit 212 activates DAC 214 via a control signal on line 229. DAC 214 responds by moving the new digital data from its input buffer to an active register, forcing the output voltage on line 233 to move to a voltage corresponding to the new digital data. The new DAC voltage is applied to VCO 209 through voltage summer 208. VCO 209 responds by moving to the new frequency. Another important feature of the present invention that is described in greater detail hereinbelow is that the digital data supplied to DAC 214 is highly accurate due to the feed-forward arrangement shown in FIG. 1c. Because of the highly accurate data provided to DAC 214 it can be assumed for purposes of discussion that the frequency change occurs virtually instantaneously when VCO 209 responds to the DAC voltage change. In applications requiring a high degree of frequency accuracy, the PLL in accordance with the present invention will require some additional settling after DAC 214 is used to pretune VCO 209. In less precise applications, however, the DAC pretune is sufficient to provide usable frequency. In other words, the communication equipment does not need to wait for output 224 to settle to the new frequency.

At the same time DAC 214 is activated the divide ratio of divide-by-N circuit 211 is changed via a signal provided by control circuit 212 on control line 227. The new divide ratio corresponds to the required divide ratio to phase lock to the new frequency.

By opening PLL 200 using switch 217, the PLL cannot respond to transients caused by a rapidly changing VCO 209 to a new frequency. Additionally, by providing VCO 209 with a highly accurate drive voltage from DAC 214, the new frequency is immediately present and available on output 224 of PLL 220.

In summary, the pretune process occurs as follows:
1. The PLL 200 outputs a stable first given frequency ($f_1$).
2. A signal is received on bus 236 directing the control circuit 212 to change PLL 200 to output a second given frequency ($f_2$).
3. The digital signal for $f_2$ is delivered to a temporary buffer in DAC 214.
4. The control circuit opens switch 217 and freezes the residual analog value on line 232.

At this stage in the process, PLL 200 still outputs the stable first frequency. The process continues:
5. The DAC 214 transfers the digital signal for the second given frequency to an active register.
6. DAC 214 converts the digital signal for the second given frequency to an analog value and delivers the analog value to the summer 208.
7. VCO 209 immediately outputs the second given frequency.

The order of the above steps can be altered without departing from the spirit of the present invention. Likewise, other circuit designs could be provided to accomplish the same teachings.

3. Phase Synchronization

PLL 200 remains open after DAC 214 changes to the new output voltage. Although the frequency at output 224 is substantially accurate and usable, there may remain a large phase offset between the divided output frequency on line 226 and the divided reference frequency on line 219. It will be recalled that this large phase offset on line 221 caused prior art PLLs to create an error signal corresponding to the phase offset even though the PLL output was at the correct frequency. This error signal, in turn, produced a slow frequency excursion in the PLL and a finite settling time before the PLL could correct itself.

The present invention eliminates this phase offset error and settling time by keeping switch 217 open, and thus PLL 200 inactive, until the phase offset can be corrected. Control circuit 212 monitors the divided output frequency on line 226. Divide-by-N circuit 211 generates a "divider output pulse" on line 226 at the end of a divide cycle. In other words, at the Nth pulse of a divide by N divider, the divider output pulse is generated. When control circuit 212 detects the divider output pulse on line 226, it produces a control signal on line 238 that causes divide-by-M circuit to reset. This action essentially phase synchronizes the outputs of the divider circuits 202 and 211, and thus eliminates the phase offset at the inputs to phase detector 203.

A small residual phase error may still remain at this stage due to the fact that divide-by-M circuit may be at a random phase when control circuit 212 issues the reset signal. This residual phase error will cause phase detector 203 to produce a small error signal at output 221. To prevent even this small error signal from propagating through to VCO 209, switch 217 remains open until analog error correction circuitry in accordance with the present invention further minimizes the residual phase error.

It can be appreciated that the phase synchronization method of the instant invention, together with using a DAC to pretune the VCO for a frequency change, greatly diminish frequency excursions at output 224 when a frequency change takes place. It should be understood that resetting divide-by-M circuit 202 does not actually change the phase relationship between output 224 and the signal generated by reference oscillator 201. Instead, the phase of the divided reference signal on line 219 and the divided output signal on line 226 are aligned. In a sense then, phase alignment between output 224 and reference oscillator 201 is simulated by PLL 200 in accordance with the present invention. However, recognizing that phase detector 203 only responds to the apparent phase difference on the divided reference and output lines, PLL 200 responds as if the phases were aligned, thereby preventing PLL 200 from responding to the inconsequential phase offset.

Although resetting divider 203 after determining that divide-by-N circuit 211 has completed its divide cycle is a convenient way to produce the apparent phase alignment of the present invention, other methods to produce this result might work as well in a particular application. For example, both dividers 202 and 211 might be reset at the same time during pretuning to create phase alignment. This and similar variations are intended to be within the scope of present invention.

In summary, the phase synchronization process begins after the pretuning by DAC 214 by detecting when divide-by-N circuit 211 reaches the end of a divide cycle. Once the divide-by-N circuit 211 reaches the end of a divide cycle, the divide-by-M circuit 202 is reset. By resetting divide-by-M circuit 202, the apparent phase difference between the divided reference signal on line 219 and the divided output signal on line 226 is greatly reduced.

4. Control Circuit Details

Control circuit 212 shown in FIG. 2 is shown and described in greater detail with reference to FIG. 3. Control circuit 212 provides two important functions. First, logic circuit 301 provides the control signals and serves as an interface to external circuitry through bus 236 and PLL enable line 234. Logic circuit 301 is essentially a state logic circuit that generates and provides the control signals in response to digital logic inputs on line 236, as described below. Second, control circuit 212 also generates an analog error correction signal in the circuitry 390 shown in FIG. 3 to the left of logic circuitry 301. The analog error correction signal is supplied to summing circuit 204 on line 232, as shown in FIG. 2. These two elements of control circuit 212 are described separately below.

A. Analog Error Cancelling

As set out above, the combination of pretuning by DAC 214 and phase synchronization by resetting divide-by-M circuit 202 provides a substantial reduction in settling time, but a residual phase error on line 221 is likely to remain. In accordance with the present invention switch 217 remains open while the error cancelling circuitry 390 shown in FIG. 3 is activated. The analog error cancelling circuitry 390 receives an input on line 221 from the output of phase detector 203 in FIG. 2. It will be recalled that the signal on this line is proportional to the residual offset error after pretuning and phase synchronization. The analog error cancelling circuit also receives control outputs from logic circuit 301 on line 322 and line 231.

Line 231, also shown in FIG. 2, is coupled to switch 217 in FIG. 2, and so the signal on line 231 causes switch 217 to open and remain open during the frequency change. As seen in FIG. 3, the signal on line 231 is also coupled directly to control switch 313 in the analog error cancelling circuit. Thus at the same time that switch 217 opens to open PLL 200, control switch 313 opens.

The analog error cancelling circuit 390 of the present invention includes an AND gate 302 that receives phase error signal on line 221 from phase detector 203, and an enable input on line 322 from the logic circuit 301. When the enable input is at logic high, the signal received on line 221 is transferred to the output of AND gate 302 on line 321.

The output of AND gate 302 is coupled through resistor 326 to the anodes of diodes 303 and 304. The cathode of diode 303 is coupled to grounded capacitor 306 by line 324. The cathode of diode 304 is coupled through resistor 327 to grounded capacitor 307 on line 328. Lines 324 and 328 provide differential inputs to amplifier 308. Line 324 from the cathode of diode 303 is coupled to the non-inverting input of amplifier 308, while line 328 from the cathode of diode 304, through resistor 327, is coupled to the inverting input of amplifier 308. The output of amplifier 308 is coupled to switch 313, and so is floating when switch 313 is open. When switch 313 is closed, the output of amplifier 308 is coupled through RC circuit 314 to line 232 which provides the error correction signal to PLL 200 as shown in FIG. 2.

Line 328 is also coupled through switch 311 to a voltage reference, illustrated by simple voltage divider circuit 316. Line 324 is coupled through switch 312 to ground. Switches 311 and 312 are controlled by a common control signal on line 323 and so will open and close at the same time. The control signal on line 323 is provided by NOR gate 309. NOR gate 309 generates the output signal in response to inputs from logic circuit 301 on lines 231 and 322. Thus, switches 311 and 312 are open except when both line 231 and line 322 are at a logic low. Switches 311 and 312 as well as switch 313 described above may comprise bipolar or field effect switches, or the like.

Activity in the analog error cancelling circuit 390 begins when the logic signal on line 231 causes switch 217 (FIG. 2) and switch 313 to open. In the preferred embodiment this occurs when logic circuit 301 generates a logic low on line 231. Opening switch 313 disconnects the analog error correction signal generated by amplifier 308 from line 232 and prevents any response in the analog error correction circuit from affecting VCO 209 in FIG. 2 until the frequency jump is completed.

Because the output on line 231 and the output on line 322 is logic low, NOR gate 309 generates a logic high closing switches 311. Thus, when logic circuit 301 generates a logic low on line 231, switches 311, 312 close while switches 313 and 217 (FIG. 2) open. In this state, the capacitor in RC circuit 314 retains any analog error signal generated before switch 313 is opened, and will retain this signal during the frequency change. This feature is desirable in that a sudden change caused by removing the analog error signal would be transferred to VCO 209 via line 232 in FIG. 2, thereby destabilizing the first given frequency output.

Closing switch 311 couples line 328 to the reference voltage generated by voltage divider 316, so capacitor 307 charges to the same voltage as voltage divider 316. The voltage on voltage divider 316 is set to approximate a typical operating voltage that will accrue on capacitor 306 in operation. The source of this typical voltage on capacitor 306 is made apparent below. At the time switch 312 is closed, however, capacitor 306 is discharged to ground to clear any previous voltage.

At this time, logic circuit 301 generates the output on line 229 directing DAC 214 to change to the new output voltage as described above. After DAC 214 pretunes VCO 209 and the phase synchronization takes place by resetting divide-by-M circuit, logic circuit 301 generates a logic high on output 322 going to AND gate 302 in FIG. 3. This logic high signal when NORed with the logic high signal on line 231 produces a logic low on line 323, thus switches 311 and 312 are opened. The logic high on line 322 also enables AND gate 302 so that the residual phase error signal on line 221 passes throughhAND gate 302 to diodes 303 and 304.

After the residual phase error signal appears on line 321 at the output of AND gate 302, it passes through resistor 326 and diode 303 to charge capacitor 306. Resistor 326 and capacitor 306 act as an integrator to produce a voltage on capacitor 306 that is linearly proportional to the pulse width that appears at the output of AND gate 302. It will be recalled that phase detector 203 in FIG. 2 generates a pulse width modulated (PWM) error signal indicating the phase offset by a variable width pulse. Diode 303 and capacitor 306 form an integrate and hold circuit to integrate and store the residual phase error signal. Diode 304 prevents the reference voltage stored on capacitor 307 from passing back to interfere with the residual phase error signal on line 324. Resistor 327 is sized to prevent any significant portion of the residual phase error signal from reaching capacitor 307. A typical value for resistor 327 might be greater than 10,000 ohms.

A reverse leakage current will exist through diodes 303 and 304 which acts to discharge the voltage stored on capacitors 306 and 307 respectively. It is desirable that diodes 303 and 304 have matching leakage currents so that capacitors 306 and 307 discharge at the same rate. This also explains why capacitor 307 was previously charged to approximate the voltage that appears on capacitor 306. Because the voltages are similar and the leakage paths are similar capacitor 307 will follow the discharge of capacitor 306. The voltage on capacitor 307 can be subtracted from the voltage on capacitor 306 to cancel out error caused by discharging through the parasitic leakage currents.

This subtraction of voltages on capacitors 306 and 307 is provided by amplifier 308. The output of amplifier 308 is thus a voltage proportional to the residual phase error and has been compensated for the effects of leakage current through diode 303. Because leakage current varies significantly with temperature, this correction is an important advantage of the present invention.

At this point the analog error correction signal is complete. Logic circuit 301 changes output on line 231 to a logic low, thus closing switch 313 and coupling the analog error correction signal through RC circuit 314 to PLL 200 on line 232. Returning to FIG. 2, it can be seen that changing the control signal on line 231 also results in closing switch 217. This event causes the output of phase detector 203 to be coupled through switch 217 to summation circuit 204 on line 222.

Although the output of phase detector 203 still contains the residual error, summation circuit 204 removes the residual error by adding the phase detector 203 output to the analog error correction signal on line 232 which counteracts the residual error in the phase detector output. Summation circuit 204 thus provides an output to loop filter 206 that contains minimal phase error. Thus, PLL 200 is successfully closed without perturbing PLL 200 and causing undesirable frequency excursions at output 224.

The logic devices such as AND gate 302, NOR gate 309, and switches 311, 312, and 313 can be provided by commercially available logic in CMOS, ECL, or any other available logic technology. The circuit may be provided by assembling discrete components on a printed circuit board, by a custom designed application specific integrated circuit, or by programmable logic devices such as a programmable logic array or programmable gate array type devices. The particular implementation is a design choice based on resources available and cost constraints for a particular application. This design choice is within the skill of a circuit designer. Any phase error remaining in PLL 200 is small enough at this point that it can be left for PLL 200 to correct without causing undue increase in settling time.

In summary, the analog error correction circuit samples the output of phase detector 203 after the frequency change and phase synchronization steps. The sampled signal is used to create an analog correction signal which cancels or counteracts the effects of any residual phase offset between the divided output signal on line 226 and the divided reference signal on line 219. Notably, the frequency change is accomplished rapidly without changing bandwidth of loop filter 207. Unlike previous PLL circuits, the present invention provides a frequency change circuit wherein the PLL is not relied on to make the frequency change, and is only closed after the frequency change to accurately maintain the new frequency. PLL 200 may generate subtle, minor corrections that fine tune PLL 200 to an optimal frequency, however, as described below.

B. Pretuner Refinement

Referring again to FIG. 3, logic circuit 301 includes circuitry for refining the DAC pretuner described above by updating the stored digital information used to direct DAC 214 to move to a new output voltage. Logic circuit 301 includes a memory 216 that serves as a look-up table for the digital values supplied to DAC 214. Memory 216 is capable of delivering the stored digital data in serial or parallel form on line 237 from locations addressed by circuitry (not shown) internal to logic circuit 301, or provided externally through bus 236.

Preferably, memory 216 comprises a type of memory that can be written to or updated rather than simply stored. Also, memory 216 is preferably organized so that a digital value stored in a particular address can be both incremented and decremented in response to a control signal. This type and organization of memory is commercially available, or can be provided within logic circuit 301 by an application specific device, gate array, or the like.

Logic circuit 301 receives an input on line 228 from comparator 213 shown in FIG. 2. Reviewing comparator 213 in FIG. 2, it is seen that comparator produces an output indicating if the voltage on line 223 is larger than a predetermined threshold value. Once PLL 200 has settled, the voltage on line 223 represents the difference between the voltage input to VCO 209 required to produce an optimally correct frequency output on line 224, and the drive voltage supplied by DAC 214 on line 233. Because ideally DAC 214 produces a voltage very near the optimally correct voltage, the signal on line 223 is small.

Figure 3:
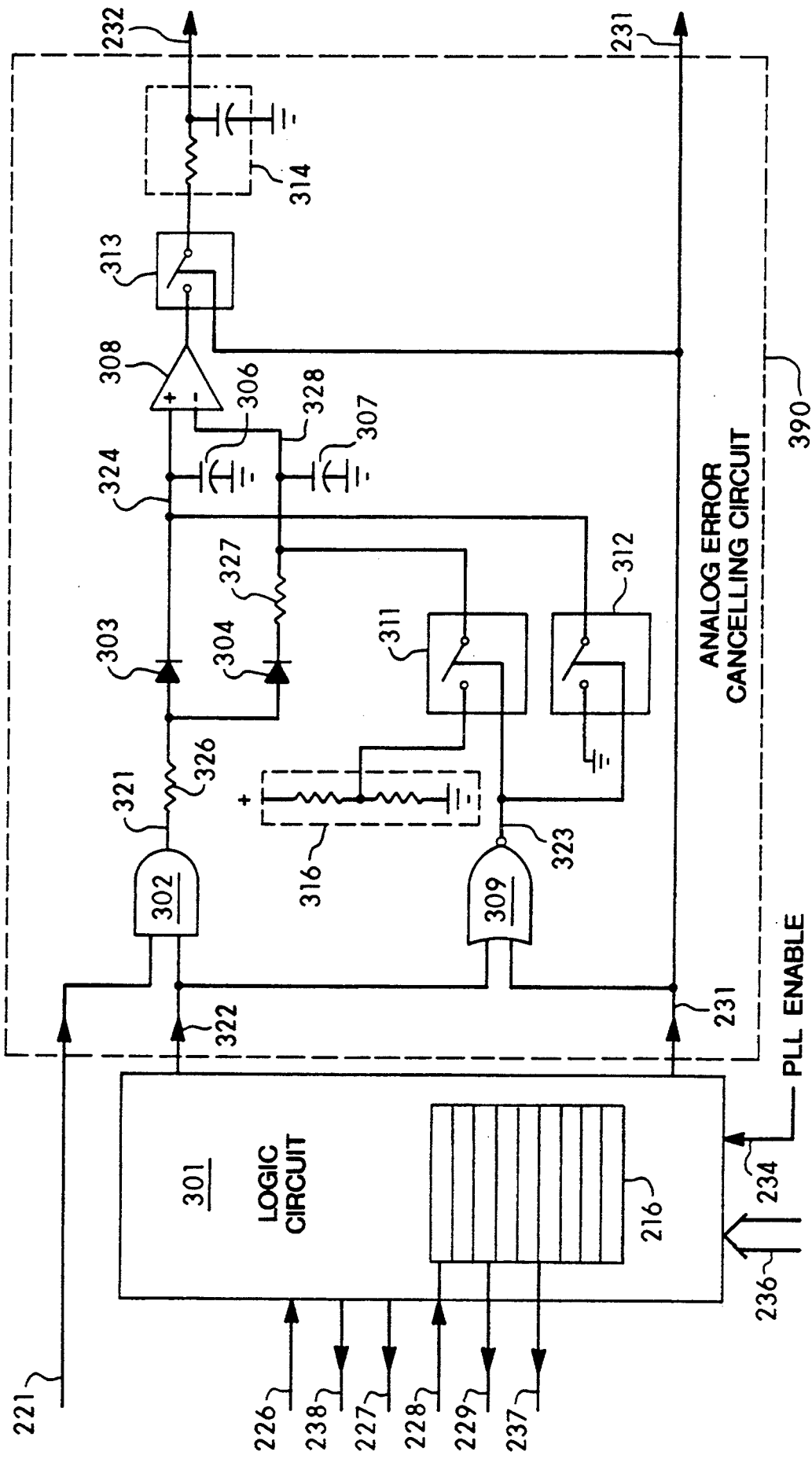
FIG. 3 is a schematic of a control circuit of the present invention for providing control signals and for generating the temperature compensated error correction signal.

In accordance with the present invention, comparator 213 determines if the signal on line 223 is larger than a predetermined threshold value, and if it is, generates an output to logic circuit 301 shown in FIG. 3. Logic circuit 301 then causes the value stored at the addressed portion of memory 216 to be incremented or decremented. This results in a more correct value stored in memory 216 which is accessed the next time the circuit is switched to the current frequency.

Preferably the digital value stored in the addressed portion of memory 216 is incremented by adding binary one to its least significant bit. This results in minimal circuit complexity. Thus, each time a particular frequency is selected by PLL 200, the stored values that drive DAC 214 are updated, and thus approach optimally correct values quickly. The continuous updating allows PLL 200 to respond quickly to changes in operating temperature or external interference while still providing unusually fast settling time.

5. Operation and Timing

Figure 4:
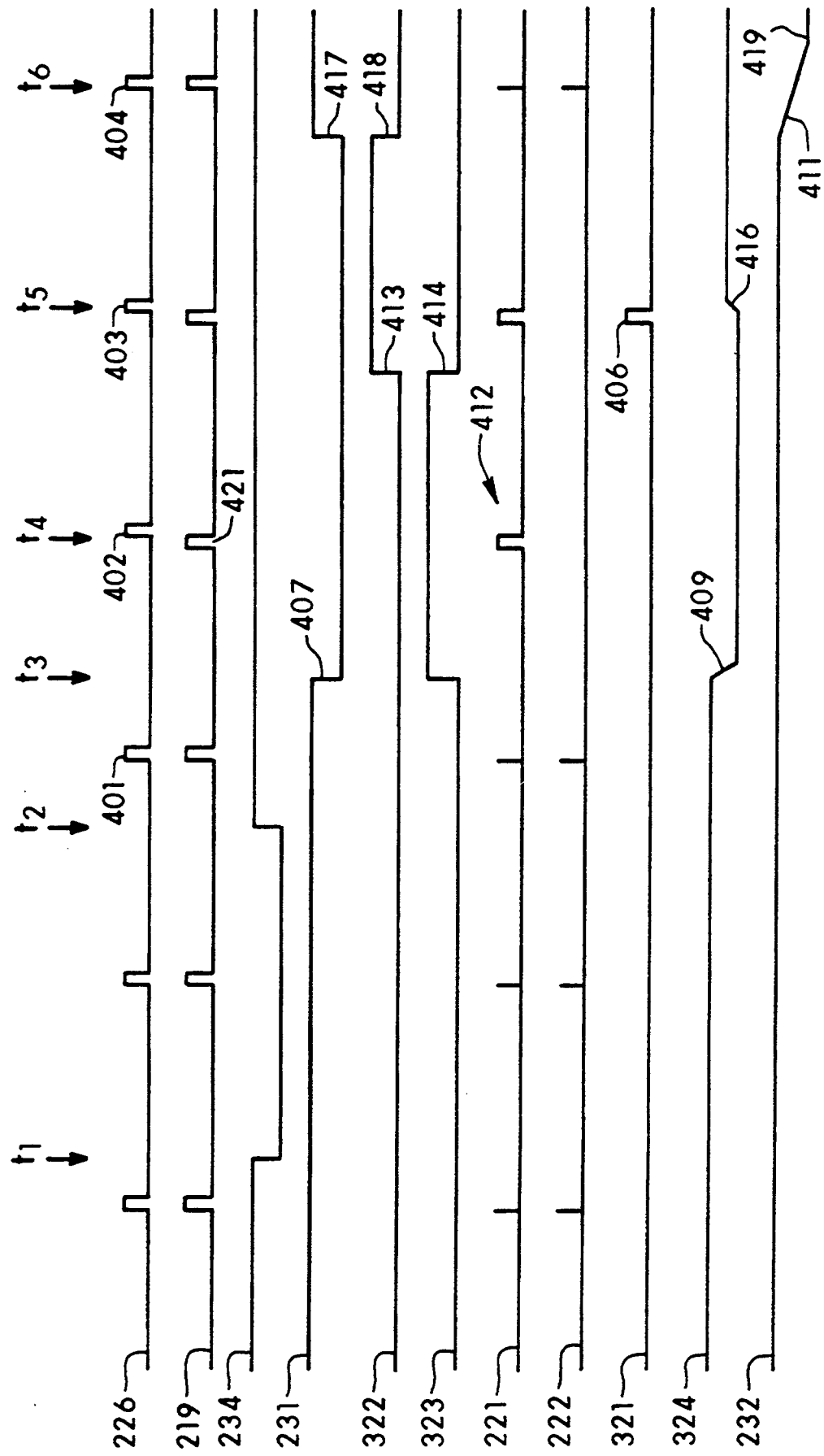
FIG. 4 provides a timing diagram for illustrating the function and utility of the PLL in FIGS. 2 and 3.

FIG. 4 illustrates timing diagrams useful in understanding the operation of PLL 200 described above. The timing diagrams set out a relationship between the events described above during a switch from a first frequency to a second frequency. The reference times $t_1$–$t_5$ in FIG. 4 correspond to similarly labeled times in FIG. 1c. In general, the timing diagram of FIG. 4 illustrates the final stages of operation at a first given frequency at times $t_0$ through $t_2$ and operation at a second given frequency at times $t_4$ through $t_7$. The change in output frequency on output 224 (FIG. 2) is not noticeable on line 226 because divide-by-N circuit 211 is given a new divisor N at the same time that DAC 214 causes the frequency jump.

a. Steady State Operation

At time $t_1$ the first frequency has settled to steady state. In steady state times $t_1$–$t_3$, it should be noted that pulses on lines 226 and 219, which are the inputs to phase detector 203 in FIG. 2, are aligned. Also at $t_0$, line 231 is at a logic high, so switch 217 (FIG. 2) is closed and PLL 200 is operational. Phase detector outputs a series of narrow pulses during time $t_0$–$t_3$ indicating minimal phase offset between lines 226 and 219. The pulses on lines 221 and 222 in FIG. 4 are amplified for ease of illustration, but it should be understood that in reality PLL 200 settles to a point that its output is substantially zero (i.e. VCO 209 provides a stable first frequency) in the steady state times $t_0$–$t_3$. Lines 321, 324, and 232 indicating signals from analog error correction circuit shown in FIG. 3 are substantially steady state, holding voltage levels at the steady state analog error correction value. Also, because line 231 is at a logic high, switch 313 in FIG. 3 is closed, so the analog error correction signal is supplied to PLL 200 as described above.

b. Pretuning Operation

At time $t_1$ PLL enable line 234 changes logic states indicating that a frequency change is about to take place. PLL enable line triggers several routine operations internal to logic circuit 301 in FIG. 3 such as acquiring new frequency data from external circuitry, addressing memory 116 to access new digital values for DAC 214, and loading the new digital values into DAC 214 over data line 237. These operations require only routine logic manipulations familiar to digital circuit designers. The state change on PLL enable line 234 at $t_1$ is only indicative of a signal triggering these events, and it should be understood that other signals may trigger these events in a specific application. For purposes of making and using the present invention, it is only important that new digital data is accessed and made available to DAC 214 before the frequency change.

Time $t_2$ indicates that PLL enable on line 234 changes state again indicating that the PLL 200 is ready for a frequency hop. The next output pulse 401 on line 226 is the last pulse at the old frequency. Pulse 401 is preferably used to trigger logic circuit 301 in FIG. 3 to change logic states on line 231. In FIG. 4 this is a change from logic high to a logic low occurring at $t_3$ and identified by edge 407. This change on line 231 opens switch 217 in FIG. 2, opens switch 313 in FIG. 3. Edge 407 also causes logic circuit 301 to produce a control output on line 229 to cause DAC 214 to move to the new output voltage. Edge 407 also causes logic circuit 301 to produce a control output on line 227 to cause divide-by-N circuit 211 to change its divisor N to a new integer corresponding to the new frequency. At this time the phase synchronization takes place by outputting a reset signal on line 238 from control circuit 212 to divide-by-M circuit 202, although this action does not produce any waveforms in the timing diagram shown in FIG. 4.

c. Analog Error Correction Operation

The state change on line 231 also results in closing switches 311 and 312, resulting in a discharge of capacitor 306 as indicated generally at 409 in FIG. 4, and in the precharging of capacitor 307 (not shown in FIG. 4). During time period $t_3$ logic circuit 301 resets divide-by-M circuit in FIG. 4 resulting in a close, but not perfect phase alignment between pulses on lines 226 and 219. At time $t_4$ the first pulse of the new frequency arrives on line 226, and the residual phase error is evident between pulse 402 on line 226 and the divided reference pulse 421 on line 219. This phase offset appears at the output of phase detector 203 on line 221 as a wide pulse at time $t_4$. Also at time $t_4$, line 324, which is in the analog error correction circuitry shown in FIG. 3, has stabilized at its discharged value.

At time $t_5$ the residual phase error remains for pulse 403, again generating an error pulse on line 221. Logic circuit 301 causes a change of state 413 on line 322 which enables AND gate 302 in FIG. 3. AND gate 302 passes the error pulse on line 322 to line 321 as shown by pulse 406 on line 321. At this same time line 323 changes state as shown at 414 in FIG. 4 resulting in switches 311 and 312 in FIG. 4 opening up. Pulse 406 on line 321 passes to capacitor 306 resulting in the charging slope 416 on line 324. Line 324 quickly rises to a steady state voltage indicating the analog error correction signal.

Refinement Operation

At time $t_6$ line 231 changes state again at 417 and line 322 changes state at 418. Switch 217 (FIG. 2) which is driven by line 231, closes thereby closing PLL 200. Once switch 217 is closed, the long period 412 where the output of phase detector 203 is separated from VCO 209 ends, and minimal phase error information begins to appear on line 222 towards VCO 209. Also, switch 313 in FIG. 3 is closed, coupling the analog error correction signal on line 324 to summation circuit 204 through line 232, as indicated by waveform 419 in FIG. 4.

The instantaneous settling phase locked loop in accordance with the present invention makes a frequency change in 2 microseconds as compared to 500 microseconds for a conventional PLL. Because the new frequency is available immediately after the DAC pretune circuit changes voltages and the VCO responds to the voltage change, all of the time previously wasted during PLL settling is available for use in data transmission.

It is to be expressly understood that the claimed invention is not to be limited to the description of the preferred embodiment but encompasses other modifications and alterations within the scope and spirit of the inventive concept. For example, the two or more loop filters might be employed. Also, more logic and control functions might be incorporated into the control and logic circuits to provide additional functionality to the user. Accordingly, these modifications are within the scope of the present invention.

We claim:

1. A phase locked loop comprising:
   a voltage controlled oscillator (VCO) having a control input for receiving a drive voltage and an output, wherein the VCO produces a signal on the output having a frequency that is determined by the drive voltage;
   a filter having an input and an output, wherein the filter output is coupled to the VCO control input;
   a digital to analog converter (DAC) having an analog output continually coupled to the VCO control input and having a digital input for receiving a digital code and a control input for receiving control signals;
   a phase detector having first and second inputs for receiving signals and an output, wherein the phase detector generates an error signal on the output that is determined by any phase offset between the signals on the first and second inputs
   a switch having an output coupled to the input of the filter, an input coupled to the output of the phase detector, and a control input, for controllably coupling and decoupling the error signal on the phase detector output to the input of the filter in response to a signal on the control input;
   a feedback circuit coupled from the VCO output to the second input of the phase detector for providing a feedback signal to the second input of the phase detector;
   a reference signal means having a reset input and an output coupled to the first input of the phase detector for providing a reference signal to the first input of the phase detector; and
   a control circuit having a first control output coupled to the control input of the switch, a second control output coupled to the control input of the DAC, a digital data output coupled to the digital data input of the DACs, a first input to the control circuit coupled to the feedback circuit, the first input for receiving the feedback signal from the feedback circuit, wherein the control circuit serves to open the switch before causing the DAC to change output voltage and wherein the control circuit provides a reset output signal to the reset input of the reference signal generator to synchronize the feedback signal with the reference signal; and means for generating an analog error cancelling signal having an input coupled to the phase detector output and an output coupled to the input of the loop filter, wherein the analog error cancelling signal cancels at least a portion of the error signal on the phase detector output.

2. The phase locked loop of claim 1 further comprising comparator means having a first input coupled to the output of the filter, a second input coupled to ground, and a comparison output coupled to the control circuit for providing a comparison signal determined by the difference between the voltage on the first input and the ground potential on the second input.

3. The phase locked loop of claim 2 wherein the control circuit further comprises:

a logic circuit having a memory, wherein the digital codes are stored in addresses of the memory;

a comparator input coupled to the comparison output of the comparator means for receiving the comparison signal from the comparator means, wherein the digital code is periodically updated in response to a signal on the comparator input.

4. A phase locked loop comprising:

a voltage controlled oscillator (VCO) having a control input for receiving a drive voltage and an output, wherein the VCO produces a signal on the output having a frequency that is determined by the drive voltage;

a filter having an input and an output, wherein the filter output is coupled to the VCO control input;

a digital to analog converter (DAC) having an analog output continually coupled to the VCO control input and having a digital input for receiving a digital code and a control input for receiving control signals;

a phase detector having first and second inputs for receiving signals and an output, wherein the phase detector generates an error signal on the output that is determined by any phase offset between the signals on the first and second inputs a switch having an output coupled to the input of the filter, an input coupled to the output of the phase detector, and a control input, for controllably coupling and decoupling the error signal on the phase detector output to the input of the filter in response to a signal on the control input;

a feedback circuit coupled from the VCO output to the second input of the phase detector for providing a feedback signal to the second input of the phase detector;

a reference signal generator having a reset input and having an output coupled to the first input of the phase detector for providing a reference signal to the first input of the phase detector;

a control circuit having a first control output coupled to the control input of the switch, a second control output coupled to the control input of the DAC, a digital data output coupled to the digital data input of the DAC, a first input to the control circuit coupled to the feedback circuit, the first input for receiving the feedback signal from the feedback circuit, wherein the control circuit serves to open the switch before causing the DAC to change output voltages and the control circuit provides a reset output signal to the reset input of the reference signal generator to synchronize the feedback signal with the reference signal;

means for generating an analog error cancelling signal having an input coupled to the phase detector output and an output coupled to the input of the loop filter, wherein the analog error cancelling signal cancels at least a portion of the error signal on the phase detector output, wherein the analog error cancelling means further comprises:

an AND gate having a first input coupled to receive the error signal from the phase detector output, a second input coupled to receive an enable signal; and an output for providing a sample error signal when the enable input is at a logic high state;

a first grounded capacitor coupled to the output of the AND gate for storing the sample error signal, wherein the first grounded capacitor is also coupled to a first parasitic leakage path which discharges the first grounded capacitor;

a second grounded capacitor for storing a reference voltage, wherein the second grounded capacitor is coupled to a second parasitic leakage path which discharges the second grounded capacitor;

a operational amplifier having a non-inverting input coupled to receive the stored sample error signal on the first grounded capacitor, an inverting input coupled to receive the stored reference voltage, and an output providing a signal proportional to the difference between voltages on the non-inverting and inverting inputs;

a second switch means having an input coupled to the operational amplifier output, a control input coupled to the first control output of the control circuit, and an output; and an RC circuit coupled between the output of the second switch and the input of the filter.

5. A method for changing frequency of an output signal generated by a phase locked loop from a first output frequency f1 to a second output frequency f2, the PLL including a voltage controlled oscillator (VCO) having an input and having an output for generating the output signal, a first frequency divider having an input coupled to the VCO output and an output producing a divided output signal, a phase detector having an output coupled to the input of the VCO and first and second inputs, the phase detector outputting an error signal to the VCO in response to a phase difference between signals received by the first and second inputs, the first input of the phase detector coupled to the first frequency divider output, and the PLL further including a DAC having an analog output coupled to the input of the VCO and a digital input for receiving a first digital code corresponding to f1 and a second digital code corresponding to f2, the method comprising the steps of:

opening the PLL while the output signal frequency remains f1;

receiving a reference signal having a frequency from a reference signal generator;

dividing the reference signal frequency by an integer (M) using a second frequency divider to produce a divided reference signal;

supplying the second digital code to the DAC;

pretuning the PLL using an analog voltage on the analog output of the DAC;

phase synchronizing the output signal and the second divided reference signal by resetting the second frequency divider;

closing the PLL;

driving the VCO using the analog voltage on the analog output of the DAC after the PLL is closed; and sampling the error signal on the phase detector output after the step of phase synchronizing;

generating an analog error cancelling signal from the sampled error signal; and cancelling residual phase error by adding the analog error cancelling signal to the phase detector output.

6. The method of claim 5 further comprising the steps of:

after closing the PLL, sampling the input to the VCO and updating the second digital code based on the value of the sampled VCO input.

7. A phase locked loop comprising:

a voltage controlled oscillator (VCO) means for producing an output signal having a selected frequency;

a digital-to-analog converter (DAC) for providing an analog voltage to the VCO;

control means for providing a binary code word to the DAC;

feedback means for producing a feedback signal from the output signal;

phase detector means for providing an error signal to the VCO, the error signal representing a phase difference between the feedback signal and a reference signal;

first summing means for summing the error signal and the analog voltage to form a drive voltage for the VCO;

switch means controlled by the control means for coupling and decoupling the error signal to the summing means;

analog error correction means for sampling the error signal when the error signal is decoupled from the summing means, integrating the sampled error signal over time, and providing an analog error correction signal representing any residual phase error; and second summing means for summing the analog error correction signal with the error signal when the error signal is coupled to the summing means.

8. A phase locked loop comprising:

a voltage controlled oscillator (VCO) means for producing an output signal having a selected frequency;

a digital-to-analog converter (DAC) for providing an analog voltage to the VCO;

control means for providing a binary code word to the DAC;

feedback means for producing a feedback signal from the output signal;

phase detector means for providing an error signal to the VCO, the error signal representing a phase difference between the feedback signal and a reference signal;

first summing means for summing the error signal and the analog voltage to form a drive voltage for the VCO;

switch means controlled by the control means for coupling and decoupling the error signal to the summing means;

analog error correction means for sampling the error signal when the error signal is decoupled from the summing means, integrating the sampled error signal over time, and providing an analog error correction signal representing any residual phase error, wherein the analog error correction means further comprises means for sampling the error signal including an AND gate having a first input coupled to receive the error signal from the phase detector output, a second input coupled to receive an enable signal from the control means; and an output for providing a sampled error signal when the enable input is at a logic high state; and second summing means for summing the analog error correction signal with the error signal when the error signal is coupled to the summing means.

9. The phase locked loop of claim 8 wherein the analog error correction means further comprises: means for integrating the sampled error signal including a first grounded capacitor coupled to the output of the AND gate for storing the sampled error signal, wherein the first grounded capacitor is also coupled to a first parasitic leakage path which discharges the first grounded capacitor.

10. The phase locked loop of claim 9 wherein the analog error correction means further comprises:

a second grounded capacitor for storing a reference voltage, wherein the second grounded capacitor is coupled to a second parasitic leakage path which discharges the second grounded capacitor; and means for subtracting the stored reference voltage on the second grounded capacitor from the stored sampled error signal on the first grounded capacitor, wherein the means for subtracting provides the analog error correction signal to the second summing means.

* * * * *